(12) United States Patent
Gottwald et al.

(10) Patent No.: US 10,079,337 B2
(45) Date of Patent: Sep. 18, 2018

(54) DOUBLE MAGNETIC TUNNEL JUNCTION WITH DYNAMIC REFERENCE LAYER

(71) Applicant: International Business Machines Corporation, Armonk, NY (US)

(72) Inventors: Matthias G. Gottwald, Yorktown Heights, NY (US); Guohan Hu, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/403,764

(22) Filed: Jan. 11, 2017

(65) Prior Publication Data

US 2018/0198058 A1    Jul. 12, 2018

(51) Int. Cl.
*H01L 27/00* (2006.01)
*H01L 43/02* (2006.01)
*H01L 43/10* (2006.01)
*H01L 43/12* (2006.01)
*H01L 27/22* (2006.01)

(52) U.S. Cl.
CPC .......... *H01L 43/02* (2013.01); *H01L 27/222* (2013.01); *H01L 43/10* (2013.01); *H01L 43/12* (2013.01)

(58) Field of Classification Search
CPC ......... H01L 43/02; H01L 43/10; H01L 43/12; H01L 27/222; H01L 27/228; H01L 27/224; H01L 27/1052
See application file for complete search history.

(56) References Cited

U.S. PATENT DOCUMENTS

| | | | | |
|---|---|---|---|---|
| 6,958,927 | B1 * | 10/2005 | Nguyen | .................. G11C 11/16 257/295 |
| 8,416,620 | B2 * | 4/2013 | Zheng | .................... B82Y 25/00 365/171 |
| 8,503,222 | B2 | 8/2013 | Suzuki et al. | |
| 8,791,534 | B2 | 7/2014 | Fukami et al. | |
| 8,884,388 | B2 | 11/2014 | Fukami et al. | |
| 8,994,130 | B2 | 3/2015 | Fukami et al. | |
| 9,082,497 | B2 | 7/2015 | Suzuki | |
| 9,190,452 | B2 | 11/2015 | Nakatsuka | |
| 9,196,335 | B2 | 11/2015 | Natori et al. | |
| 9,252,710 | B2 * | 2/2016 | Wang | .................. H01F 10/3272 |
| 9,300,301 | B2 | 3/2016 | Bromberg et al. | |
| 9,401,386 | B2 | 7/2016 | Nakatsuka | |
| 2010/0174766 | A1 * | 7/2010 | Weeks | ..................... G06F 7/588 708/255 |

(Continued)

FOREIGN PATENT DOCUMENTS

CN    105633110 A    6/2016

*Primary Examiner* — Nikolay Yushin
(74) *Attorney, Agent, or Firm* — Cantor Colburn LLP; Vazken Alexanian

(57) ABSTRACT

A double magnetic tunnel junction (DMTJ) device includes a fixed reference layer of a first magnetic material having a perpendicular magnetic anisotropy with a magnetic moment that is fixed. The device also includes a free layer of a second magnetic material having a perpendicular magnetic anisotropy with a magnetic moment that is changeable based on a current. A dynamic reference layer of a third magnetic material has an in-plane magnetic anisotropy and a changeable magnetic moment. The free layer is disposed between the fixed reference layer and the dynamic reference layer.

16 Claims, 5 Drawing Sheets

"1"         "0"

(56) References Cited

U.S. PATENT DOCUMENTS

| | | | |
|---|---|---|---|
| 2011/0058412 A1* | 3/2011 | Zheng | B82Y 25/00 365/173 |
| 2015/0248939 A1 | 9/2015 | Nebashi et al. | |
| 2015/0295166 A1 | 10/2015 | Suzuki | |
| 2016/0049445 A1 | 2/2016 | Nakatsuka | |

* cited by examiner

DOUBLE MAGNETIC TUNNEL JUNCTION WITH DYNAMIC REFERENCE LAYER

BACKGROUND

The present invention relates to magnetoresistive random-access memory (MRAM), and more specifically, to a double magnetic tunnel junction (DMTJ) with a dynamic reference layer.

MRAM is a non-volatile memory that combines a magnetic device with standard silicon-based microelectronics. Data is stored in MRAM as magnetic states or characteristics (e.g., polarity or magnetic moment) instead of electric charges. In a typical configuration, each MRAM cell includes a transistor, a magnetic tunnel junction (MTJ) device (i.e., memory cell) for data storage, a bit line and a word line. A typical MTJ structure includes a stacked configuration having a fixed magnetic layer, a thin dielectric tunnel barrier, and a free magnetic layer. The MTJ has a low resistance when the magnetic moment of its free layer is parallel to the magnetic moment of its fixed layer. Conversely, the MTJ has a high resistance when its free layer magnetic moment is oriented anti-parallel to its fixed layer magnetic moment. The MTJ can be read by activating its associated word line transistor, which switches current from a bit line through the MTJ. The MTJ resistance can be determined from the sensed current, which is itself based on the polarity of the free layer. Conventionally, if the fixed layer and free layer have the same polarity, the resistance is low and a "0" is read/written. If the fixed layer and free layer have opposite polarity, the resistance is higher and a "1" is read/written.

SUMMARY

According to an embodiment of the present invention, a double magnetic tunnel junction (DMTJ) device includes a fixed reference layer of a first magnetic material having a perpendicular magnetic anisotropy with a magnetic moment that is fixed, and a free layer of a second magnetic material having a perpendicular magnetic anisotropy with a magnetic moment that is changeable based on a current. A dynamic reference layer of a third magnetic material has an in-plane magnetic anisotropy and a changeable magnetic moment. The free layer is disposed between the fixed reference layer and the dynamic reference layer.

According to another embodiment, a method of fabricating a double magnetic tunnel junction (DMTJ) device includes forming a fixed reference layer of a first magnetic material. The first magnetic material has a perpendicular magnetic anisotropy with a fixed magnetic moment. A free layer of a second magnetic material is formed above the fixed reference layer. The second magnetic material has a perpendicular magnetic anisotropy with a changeable magnetic moment. A dynamic reference layer of a third magnetic material is formed above the free layer. The third magnetic material has an in-plane magnetic anisotropy and a changeable magnetic moment.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 2a through 2d show the stages involved in writing a data value of "1" in the DMTJ device according to one or more embodiments, in which:

FIG. 2a shows an initial stage in which the DMTJ device holds a data value of "0";

FIG. 2b shows a stage resulting from initial application of a switching current;

FIG. 2c shows a change in state of the free layer of the DMTJ device based on the switching current; and FIG. 2d shows the state of the DMTJ device that holds a data value of "1" after the switching current has been turned off;

FIG. 3a through 3e show the stages involved in writing a data value of "1" in the DMTJ device according to one or more embodiments when the switching current is maintained longer than needed, in which:

FIG. 3a shows an initial stage in which the DMTJ device holds a data value of "0";

FIG. 3b shows a stage resulting from initial application of a switching current;

FIG. 3c shows a change in state of the free layer of the DMTJ device based on the switching current;

FIG. 3d shows a change in state of the dynamic reference layer based on maintaining the switching current; and FIG. 3e shows the state of the DMTJ device that holds a data value of "1" after the switching current has been turned off;

FIGS. 4a through 4d show the stages involved in writing a data value of "0" in the DMTJ device according to one or more embodiments, in which:

FIG. 4a shows an initial stage in which the DMTJ device holds a data value of "1";

FIG. 4b shows a stage resulting from initial application of a switching current;

FIG. 4c shows a change in state of the free layer of the DMTJ device based on the switching current; and FIG. 4d shows the state of the DMTJ device that holds a data value of "0" after the switching current has been turned off;

FIG. 5a through 5e show the stages involved in writing a data value of "0" in the DMTJ device according to one or more embodiments when the switching current is maintained longer than needed, in which:

FIG. 5a shows an initial stage in which the DMTJ device holds a data value of "1";

FIG. 5b shows a stage resulting from initial application of a switching current;

FIG. 5c shows a change in state of the free layer of the DMTJ device based on the switching current;

FIG. 5d shows a change in state of the dynamic reference layer based on maintaining the switching current; and FIG. 5e shows the state of the DMTJ device that holds a data value of "0" after the switching current has been turned off.

DETAILED DESCRIPTION

Figure 1:
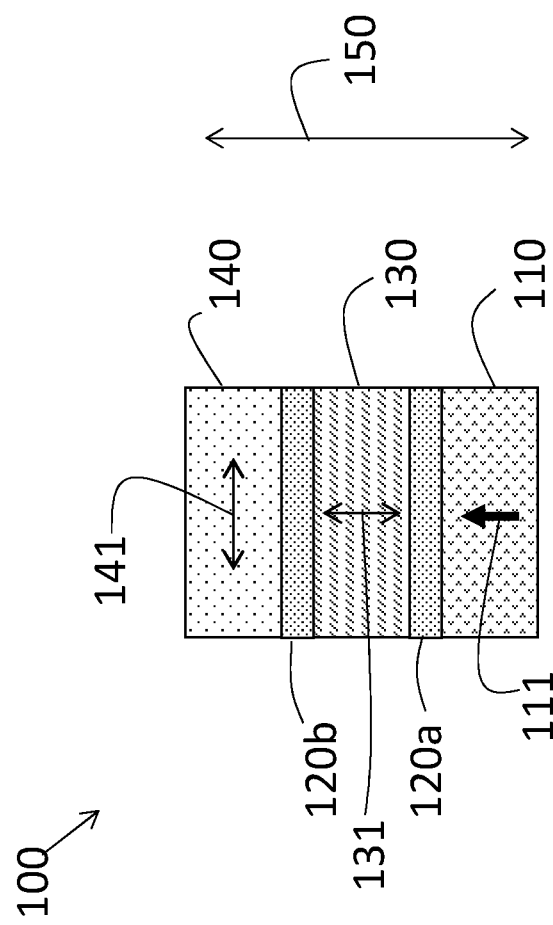
FIG. 1 shows a cross-sectional view of a double magnetic tunnel junction (DMTJ) device according to one or more embodiments.

An MRAM is a non-volatile random-access memory technology. Unlike conventional RAM technologies that store data as an electric charge or current flow, an MRAM stores data with magnetic storage elements. Spin Transfer Torque MRAM (STT-MRAM) uses electrons that have been spin-polarized to switch the magnetic state (i.e., the magnetization or magnetic moment) of the MTJ free layer.

During the write operation, the spin-polarized electrons exert a torque on the free layer, which can switch the free layer magnetic state. Thus, the required amount of STT-MRAM writing current depends on how efficiently spin polarization is generated. Additionally, designs that keep write currents small (e.g., $I_c$<25 micro-ampere) are important to improving STT-MRAM scalability. This is because a larger switching current would require a larger transistor area, which would inhibit the ability to scale up STT-MRAM density.

Generally, MRAM and/or STT-MRAM include an MTJ, which acts as a data storage element. A known MTJ configuration includes two ferromagnetic plates separated by an insulating layer (i.e., a tunnel barrier). One of the two plates, which can be referred to as a pinned layer or a reference layer, has a fixed magnetization that is fixed to a particular magnetization. Magnetization is the vector field that expresses the density of the magnetic dipole moment in magnetic material. The magnetization of the other plate, which can be referred to as a free layer, can be changed with the application of a current, which can be referred to as a switching current. Writing data is accomplished by passing current through the junction in one direction or the other to change the magnetization of the free layer to be either parallel or anti-parallel with that of the reference layer. This changes the resistance of the device to reflect a data value. Reading data is accomplished by reading the resistance of the device using a smaller current than the switching current that is used to write the data.

When the switching current is passed from the reference layer to the free layer, the magnetization of the free layer is made anti-parallel with the magnetization of the pinned layer. When the switching current is passed from the free layer to the reference layer, the magnetization of the free layer is made parallel with the magnetization of the pinned layer. The threshold switching current that is needed is related to the activation energy which, in turn, is associated with the barrier energy that must be overcome to cause a switch in the state of the device. When the barrier energy is high, switching the magnetization of the free layer requires higher activation energy then when the barrier energy is low. Higher barrier energy in turn requires a higher switching current. Higher barrier energy also means better retention of data. That is, although higher switching current is needed to set the data when the barrier energy is high, that same barrier energy prevents unwanted switching of the state of the free layer based on temperature changes, for example. As a result, retention of the data is improved with increased barrier energy. High barrier energy, which improves data retention, requires a higher switching current.

When the MTJ includes a double tunnel junction, the switching current can be lowered without negatively affecting retention. Specifically, two reference layers are arranged on either side of a free layer with an insulating layer (i.e., tunnel barrier) between each reference layer and the free layer. Spin torque is applied to the free layer from two opposite sides (e.g., top and bottom). However, although this arrangement lowers the switching current required to change the magnetization (i.e., magnetic moment) of the free layer, the physical implementation is difficult to achieve with conventional double magnetic tunnel junctions.

Turning now to an overview of aspects of the present invention, one or more embodiments relate to a DMTJ device with one reference layer that has in-plane magnetic anisotropy. The resistance of the device and, thus, the data value that is set, are based on only one of the two reference layers and the free layer. As a result, the double junction device according to the one or more embodiments has simplified implementation because it eliminates the need to ensure that the two reference layers are both in correct magnetic states. In addition, the state of one of the reference layers need not be retained in order to retain the data setting.

Turning now to a more detailed description of one or more embodiments, FIG. 1 shows a cross-sectional view of a DMTJ device 100 according to embodiments of the present invention. The device 100 has a fixed reference layer 110, a first tunnel barrier layer 120a, a free layer 130, a second tunnel barrier layer 120b, and a second dynamic reference layer 140, configured and arranged as shown. The fixed reference layer 110 includes a fixed perpendicular magnetic anisotropy. That is, the magnetic moment 111 of the fixed reference layer 110 is parallel with respect to the direction of flow of the switching current 150 and does not change. A second dynamic reference layer 140 of the device 100 has an in-plane magnetic anisotropy and its magnetic moment 141 can be changed by applying the switching current 150 for purposes of affecting the magnetic moment 131 of the free layer 130. Once the magnetic moment 131 of the free layer 130 is changed as needed, turning off the switching current 150 results in the magnetic moment 141 of the dynamic reference layer 140 returning to an in-plane direction.

Exemplary materials that make up the fixed reference layer 110 include cobalt (Co), iron (Fe), boron (B), nickel (Ni), iridium (Ir), platinum (Pt), palladium (Pd), or any combination thereof with perpendicular magnetic anisotropy. The tunnel barrier layers 120a, 120b can be any insulating material that produces tunneling magneto-resistance in the magnetic tunnel junction (e.g., magnesium oxide (MgO)).

Exemplary materials that can form the free layer 130 include cobalt iron boron (CoFeB), CoFe, Co, Ni, and Fe, with perpendicular magnetic anisotropy. The dynamic reference layer 140 can be one or a combination of CoFeB, CoFe, Co, Ni, and Fe, with in-plane magnetic anisotropy. In the default state (without the switching current 150 applied), the magnetic moment 141 of the dynamic reference layer 140 is perpendicular with respect to the direction of flow of the switching current 150. This magnetic moment 141 can be switched, based on the switching current 150, to affect a change in the magnetic moment 131 of the free layer 130. As previously noted, only the magnetic moments 111, 131 of the fixed reference layer 110 and free layer 130 affect the resistance and, thus, the data value stored by the device 100.

Figures 2A, 2B, 2C, 2D:
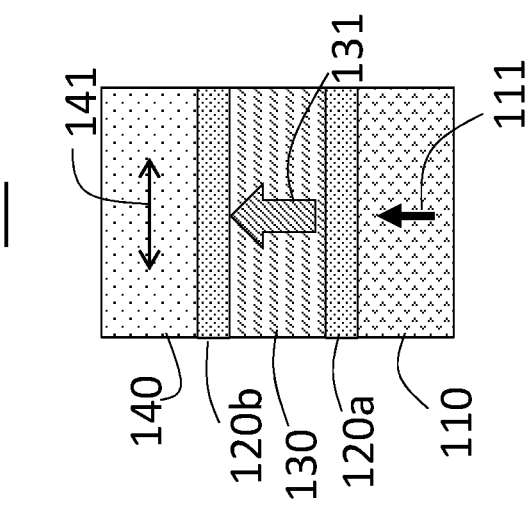

FIGS. 2a through 2d show the stages involved in writing a data value of "1" in a DMTJ device 100 according to one or more embodiments. FIG. 2a shows the magnetic moments 111, 131, 141 of the fixed reference layer 110, the free layer 130, and the dynamic reference layer 140 when the data value stored by the device 100 is "0." The magnetic moment 111 of the fixed reference layer 110 is fixed as shown. In the initial state, in which the data value is set to "0," the magnetic moment 131 of the free layer 130 is parallel with that of the fixed reference layer 110, and the magnetic moment 141 of the dynamic reference layer 140 is in-plane. When switching current 150 is applied at this state, the magnetic moments 111, 131, 141 shown in FIG. 2b result. Specifically, the switching current 150 causes the dynamic reference layer 140 to have a magnetic moment 141 that is oriented perpendicularly with (i.e., parallel with the direction of flow of the switching current 150) and is anti-parallel with the magnetic moments 111, 131 of the fixed reference layer 110 and free layer 130.

The switching current 150 is maintained, and the result is a switch in the magnetic moment 131 of the free layer 130, as shown in FIG. 2c. The magnetic moments 131, 111 of the free layer 130 and fixed reference layer 110 are now anti-parallel. This change in the magnetization of the free layer 130 relative to that of the fixed reference layer 110 results in a change in the resistance of the device 100 and a change in the data value stored by the device 100 to a "1." Once the switching current 150 is turned off, the magnetic moments 131, 111 of the free layer 130 and fixed reference layer 110 remain anti-parallel, but the magnetic moment 141 of the dynamic reference layer 140 returns to an in-plane direction, as shown.

Most applications of memory devices like the DMTJ device 100 require multiple such devices 100. Each of the devices 100 is unlikely to have exactly the same switching time. That is, the duration of the switching current 150 pulse needed to set a data value in the device 100 can differ for each device 100. For example, the required duration of switching current 150 can range from 3 to 5 nanoseconds for a given set of devices 100. In this exemplary case, the switching current 150 will be applied for 5 nanoseconds for all the devices 100 to ensure that the minimum required time is met for all the devices 100. The device 100 according to one or more embodiments can retain the data value that was set even if the switching current 150 must be maintained after the data value is set. Thus, in the exemplary case, the device 100 that requires 3 nanoseconds of the switching current 150 to set the data value can retain that data value even when the switching current 150 is maintained for 5 nanoseconds.

Figure 3A:
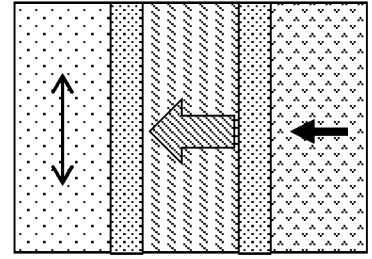
Figure 3B:
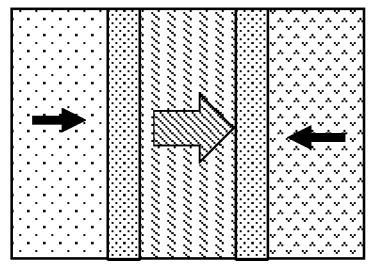
Figure 3C:
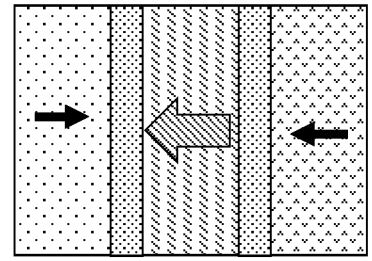

FIGS. 3a through 3e show the stages involved in writing a data value of "1" in the DMTJ device 100 according to one or more embodiments when the switching current 150 is maintained longer than needed. FIGS. 3a through 3c are respectively identical to FIGS. 2a through 2c. While the switching current 150 is turned off at this stage to result in the magnetic moments 111, 131, 141 shown in FIG. 2d, the switching current 150 is maintained after the magnetic moment 131 of the free layer 130 is made anti-parallel with that of the fixed reference layer 110, as shown in FIG. 3c.

Figure 3D:
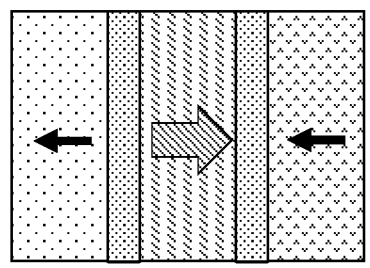
Figure 3E:
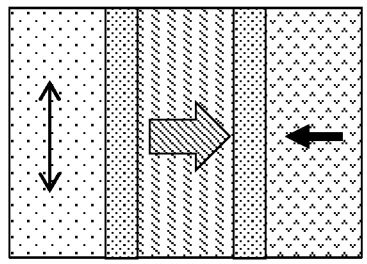

This results in the magnetic moments 111, 131, 141 shown in FIG. 3d. The magnetic moments 131, 111 of the free layer 130 and fixed reference layer 110 remain anti-parallel with each other. The magnetic moment 141 of the dynamic reference layer 140 switches from being parallel with that of the free layer 130 (in FIG. 3c) to being anti-parallel in FIG. 3d. However, this change in magnetic moment 141 of the dynamic reference layer 140 does not change the magnetic moment 131 of the free layer 130. As a result, the data value ("1") is maintained. Once the switching current 150 is turned off, the magnetic moment 141 of the dynamic reference layer 140 returns to an in-plane direction as shown in FIG. 3e. This is similar to the state shown in FIG. 2d.

Figures 4A, 4B, 4C, 4D:
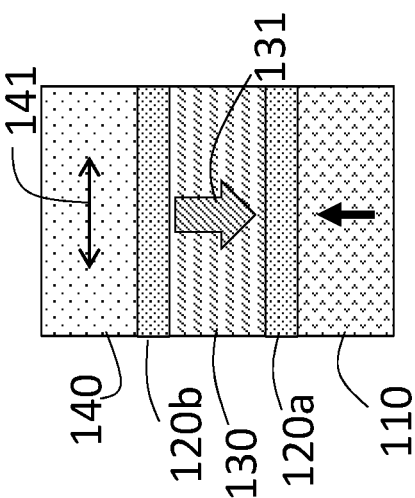

FIGS. 4a through 4d show the stages involved in changing a data value stored by a DMTJ device 100 according to one or more embodiments from "1" to "0." FIG. 4a shows that, when the data value is "1," the magnetic moments 111, 131 of the fixed reference layer 110 and the free layer 130 are anti-parallel. Also, initially, with no switching current 150 applied, the magnetic moment 141 of the dynamic reference layer 140 is in an in-plane direction. FIG. 4a is identical to FIGS. 2d and 3e.

At this stage, a switching current 150 is applied to result in the state shown in FIG. 4b. The magnetic moment 141 of the dynamic reference layer 140 spins to become parallel with that of the free layer 130, which is anti-parallel with the magnetic moment 111 of the fixed reference layer 110. Continued application of the switching current 150 at this stage results in the state shown in FIG. 4c.

FIG. 4c indicates that the magnetic moment 131 of the free layer 130 switches to become parallel with that of the fixed reference layer 110. The parallel magnetic moments 111, 131 of the fixed reference layer 110 and free layer 130 result in a resistance of the device 100 that is read as a "0." When the switching current 150 is turned off, the parallel magnetic moments 111, 131 of the fixed reference layer 110 and free layer 130 are maintained, but the magnetic moment 141 of the dynamic reference layer 140 returns to an in-plane direction, as shown in FIG. 5d. FIG. 5d is identical to FIGS. 2a and 3a.

Figure 5A:
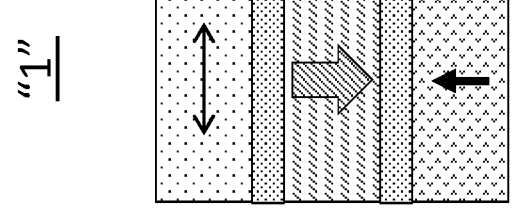
Figure 5B:
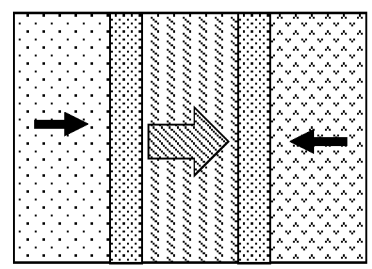
Figure 5C:
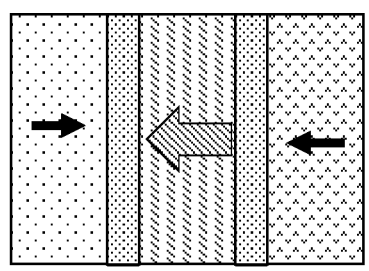
Figure 5D:
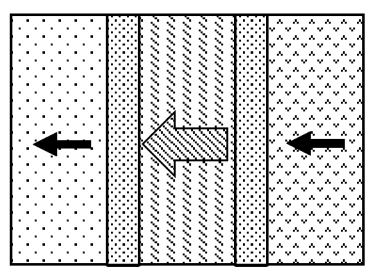

FIGS. 5a through 5e show the stages involved in writing a data value of "0" in the DMTJ device 100 according to one or more embodiments when the switching current 150 is maintained longer than needed. FIGS. 5a through 5c are respectively identical to FIGS. 4a through 4c. While the switching current 150 is turned off at this stage to result in the magnetizations shown in FIG. 4d, the switching current 150 is maintained after the magnetic moment 131 of the free layer 130 is made anti-parallel with that of the fixed reference layer 110, as shown in FIG. 5c.

Figure 5E:
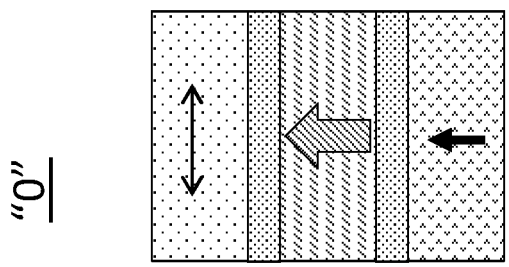

This results in the magnetic moments 111, 131, 141 shown in FIG. 5d. The magnetic moments 131, 111 of the free layer 130 and fixed reference layer 110 remain parallel with each other. The magnetic moment 141 of the dynamic reference layer 140 switches from being anti-parallel with that of the free layer 130 (in FIG. 5c) to being parallel in FIG. 5d. However, this change in magnetic moment 141 of the dynamic reference layer 140 does not change the magnetic moment 131 of the free layer 130. As a result, the data value ("0") is maintained. Once the switching current 150 is turned off, the magnetic moment 141 of the dynamic reference layer 140 returns to an in-plane direction as shown in FIG. 5e. This is similar to the state shown in FIG. 4d.

The fabrication methods and resulting devices described herein can be incorporated within the fabrication processes of IC chips. The resulting IC chips can be distributed by a fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form described. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There can be many variations to this diagram or the steps (or operations) described therein without departing from the spirit of the invention. For instance, the steps can be performed in a differing order or steps can be added, deleted or modified. All of these variations are considered a part of the claimed invention.

While the preferred embodiment to the invention had been described, it will be understood that those skilled in the art, both now and in the future, can make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A double magnetic tunnel junction (DMTJ) device, comprising:
    a fixed reference layer of a first magnetic material configured to have a perpendicular magnetic anisotropy with a magnetic moment that is fixed;
    a free layer of a second magnetic material configured to have a perpendicular magnetic anisotropy with a magnetic moment that is changeable based on a current; and
    a dynamic reference layer of a third magnetic material configured to have an in-plane magnetic anisotropy and a changeable magnetic moment, wherein the free layer is disposed between the fixed reference layer and the dynamic reference layer, further comprising a second tunnel barrier layer between the free layer and the dynamic reference layer.

2. The device according to claim 1, wherein the first magnetic material is cobalt (Co), iron (Fe), boron (B), nickel (Ni), iridium (Ir), platinum (Pt), palladium (Pd), or any combination thereof.

3. The device according to claim 1, wherein the second magnetic material is cobalt iron boron (CoFeB), cobalt iron (CoFe), cobalt (Co), nickel (Ni), iron (Fe) or any combination thereof.

4. The device according to claim 1, further comprising a first tunnel barrier layer between the fixed reference layer and the free layer.

5. The device according to claim 4, wherein the first tunnel barrier layer is magnesium oxide (MgO).

6. The device according to claim 1, wherein the second tunnel barrier layer is magnesium oxide (MgO).

7. The device according to claim 1, wherein the magnetic moment of the free layer is parallel to the magnetic moment of the fixed reference layer based on the device storing a first data value.

8. The device according to claim 1, wherein the magnetic moment of the free layer is anti-parallel to the magnetic moment of the fixed reference layer based on the device storing a second data value.

9. The device according to claim 1, wherein the magnetic moment of the dynamic reference layer is perpendicular during a change of state of the device.

10. The device according to claim 9, wherein the dynamic reference layer is configured to exhibit a change in the magnetic moment based on the current.

11. A method of fabricating a double magnetic tunnel junction (DMTJ) device, the method comprising:
    forming a fixed reference layer of a first magnetic material, the first magnetic material having a perpendicular magnetic anisotropy with a fixed magnetic moment;
    forming a free layer of a second magnetic material above the fixed reference layer, the second magnetic material having a perpendicular magnetic anisotropy with a changeable magnetic moment;
    forming a dynamic reference layer of a third magnetic material above the free layer, the third magnetic material having an in-plane magnetic anisotropy and a changeable magnetic moment; and
    forming a second tunnel barrier layer between the free layer and the dynamic reference layer.

12. The method according to claim 11, wherein the forming the fixed reference layer includes depositing cobalt (Co), iron (Fe), boron (B), nickel (Ni), iridium (Ir), platinum (Pt), palladium (Pd), or any combination thereof as the first magnetic material.

13. The method according to claim 11, wherein the forming the free layer includes depositing cobalt iron boron (CoFeB), cobalt iron (CoFe), cobalt (Co), nickel (Ni), iron (Fe) or any combination thereof as the second magnetic material.

14. The method according to claim 11, further comprising forming a first tunnel barrier layer between the fixed reference layer and the free layer.

15. The method according to claim 14, wherein forming the first tunnel barrier layer includes depositing magnesium oxide (MgO).

16. The method according to claim 11, wherein the forming the second tunnel barrier layer includes depositing magnesium oxide (MgO).

* * * * *